United States Patent
Park et al.

(10) Patent No.: US 9,759,999 B2
(45) Date of Patent: Sep. 12, 2017

(54) IMPRINTING APPARATUS AND IMPRINTING METHOD THEREOF

(71) Applicants: Samsung Display Co., Ltd., Yongin, Gyeonggi-Do (KR); Samsung Electronics Co., Ltd., Suwon-si, Gyeonggi-do (KR)

(72) Inventors: Joonyong Park, Suwon-si (KR); Dongouk Kim, Pyeongtaek-si (KR); Bongsu Shin, Seoul (KR); Daeyoung Lee, Seoul (KR); Sunghoon Lee, Seoul (KR); Jaeseung Chung, Seoul (KR); Gugrae Jo, Asan-si (KR); Sukgyu Hahm, Gyeongju-si (KR)

(73) Assignees: SAMSUNG DISPLAY CO., LTD., Gyeonggi-Do (KR); SAMSUNG ELECTRONICS CO., LTD., Gyeonggi-Do (KR)

( * ) Notice: Subject to any disclaimer, the term of this patent is extended or adjusted under 35 U.S.C. 154(b) by 192 days.

(21) Appl. No.: 14/557,602

(22) Filed: Dec. 2, 2014

(65) Prior Publication Data

US 2015/0314323 A1  Nov. 5, 2015

(30) Foreign Application Priority Data

May 2, 2014 (KR) .................. 10-2014-0053622

(51) Int. Cl.
| | | |
|---|---|---|
| *B05B 5/00* | (2006.01) | |
| *B05B 3/00* | (2006.01) | |
| *B05C 5/00* | (2006.01) | |
| *C08J 7/18* | (2006.01) | |
| *G03F 7/00* | (2006.01) | |
| *B05D 3/00* | (2006.01) | |
| *B05C 5/02* | (2006.01) | |
| *B82Y 40/00* | (2011.01) | |
| *B05D 3/06* | (2006.01) | |
| *B05D 1/42* | (2006.01) | |

(52) U.S. Cl.
CPC .................. *G03F 7/00* (2013.01); *B05C 5/02* (2013.01); *B05D 3/007* (2013.01); *B82Y 40/00* (2013.01); *G03F 7/0002* (2013.01); *B05D 1/42* (2013.01); *B05D 3/067* (2013.01)

(58) Field of Classification Search
CPC .................................. B05C 5/02; B05D 3/007
USPC ........ 118/313–315, 641–643, 323, 321, 300; 427/487
See application file for complete search history.

(56) References Cited

U.S. PATENT DOCUMENTS 7,807,087 B2   10/2010   Park et al.
8,119,052 B2   2/2012    Schumaker
(Continued)

FOREIGN PATENT DOCUMENTS

JP   2013065624 A   4/2013
KR   1020090020102 A   2/2009

*Primary Examiner* — Yewebdar Tadesse
(74) *Attorney, Agent, or Firm* — Cantor Colburn LLP

(57) ABSTRACT

An imprinting apparatus includes: a coating unit which coats a substrate with ink including a photocurable resin in a diluent; a pressing unit which presses the ink with an imprint stamp including an uneven pattern; and a light source which irradiates light to the ink, which is in a pressed state, and cures the photocurable resin. The coating unit, the pressing unit and the light source move relative to the substrate in a processing direction. The coating unit is located ahead of the pressing unit in the processing direction.

13 Claims, 3 Drawing Sheets

(56) References Cited

U.S. PATENT DOCUMENTS

| | | |
|---|---|---|
| 8,142,704 B2 | 3/2012 | Wang et al. |
| 2007/0166452 A1* | 7/2007 | Levy .................... B42D 25/328 427/157 |
| 2007/0234919 A1* | 10/2007 | Lappe ................... B41F 19/062 101/488 |
| 2014/0252679 A1* | 9/2014 | Hwang ................. B29C 59/046 264/293 |

* cited by examiner

IMPRINTING APPARATUS AND IMPRINTING METHOD THEREOF

CROSS-REFERENCE TO RELATED APPLICATIONS

This application claims priority to Korean Patent Application No. 10-2014-0053622, filed on May 2, 2014, and all the benefits accruing therefrom under 35 U.S.C. §119, the disclosure of which is incorporated herein in its entirety by reference.

BACKGROUND

1. Field

One or more embodiment of the present invention relates to imprinting apparatuses and methods of implementing minute patterns on a substrate.

2. Description of the Related Art

Due to a high integration degree of semiconductor circuits and a high resolution of flat panel display apparatuses, minute conducting wire patterns are used in such electronic devices. In a process of manufacturing a highly integrated semiconductor circuit or a high resolution flat panel display apparatus, a substrate having a minute pattern corresponding to a minute conducting wire pattern is used. The minute pattern may be, for example, a mask by which the minute conducting wire pattern is formed.

SUMMARY

In particular, as a size of a display apparatus increases, a relatively large-size minute pattern having a uniform quality is manufactured. As a process of forming the large-size minute pattern, a nanoimprint lithography method is used. According to the nanoimprint lithography method, a substrate is coated with photocurable resin, and a stamp having an uneven pattern corresponding to a minute pattern is pressed onto the photocurable resin, the photocurable resin is cured by irradiating light thereto, and then the stamp is removed from the cured resin to form the minute pattern.

However, according to the nanoimprint lithography method according to the related art, the photocurable resin that has been coated on a whole surface of the substrate, which is large, is volatilized before the pressing and curing process, and thus, a thickness of the minute pattern may not be uniform.

Provided are imprinting apparatuses and methods of forming a minute pattern having a uniform thickness.

Provided are imprinting apparatuses and methods of forming a minute pattern having a large size.

According to an embodiment of the present invention, an imprinting apparatus includes: a coating unit which coats a substrate with ink including a photocurable resin in a diluent; a pressing unit which presses the ink with an imprint stamp including an uneven pattern; and a light source which irradiates light to the ink, which is in a pressed state, and cures the photocurable resin. The coating unit, the pressing unit and the light source move relative to the substrate in a processing direction. The coating unit is located ahead of the pressing unit in the processing direction.

The coating unit may include an inkjet printing unit which ejects the ink onto the substrate.

The diluent may include a reaction group in a same chemical group as the photocurable resin.

A viscosity of the ink may be about 30 centipoise (cP) or less.

A surface tension of the ink may be about 30±20 millinetwons per meter (mN/m).

The coating unit, the pressing unit and the light source may be located at fixed locations, and the substrate may move in a moving direction opposite to the processing direction. The pressing unit may move the imprint stamp with the substrate in pressing the ink with the imprint stamp. The pressing unit may include a first pressing roller which presses the ink with the imprint stamp and a first backup roller which faces the first pressing roller with the substrate therebetween. The pressing unit may further include a second pressing roller which is located downstream from the first pressing roller in the moving direction of the substrate, and a second backup roller which faces the second pressing roller with the substrate therebetween. A pressing area, in which the ink is pressed by the imprint stamp, is formed between the first and second backup rollers. The light source irradiates the light to ink in the pressing area.

The imprinting apparatus may further include a table and a moving block. The table may support the substrate at a fixed location, the moving block may move in the processing direction, and the coating unit and the pressing unit may be mounted in the moving block so as to be moved in the processing direction. The moving block may be provided in plural, and include a first moving block in which the coating unit is mounted and a second moving block in which the pressing unit and the light source are mounted.

According to another embodiment of the present invention, an imprinting method includes: preparing the imprinting apparatus described above; the coating unit coating an upper surface of the substrate with the ink, while moving the coating unit relative to the substrate in the processing direction; the pressing unit pressing the ink with the imprint stamp, while moving the pressing unit in the processing direction at the same speed as the coating unit; and the light source curing the photocurable resin by irradiating the light to the ink in the pressed state.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
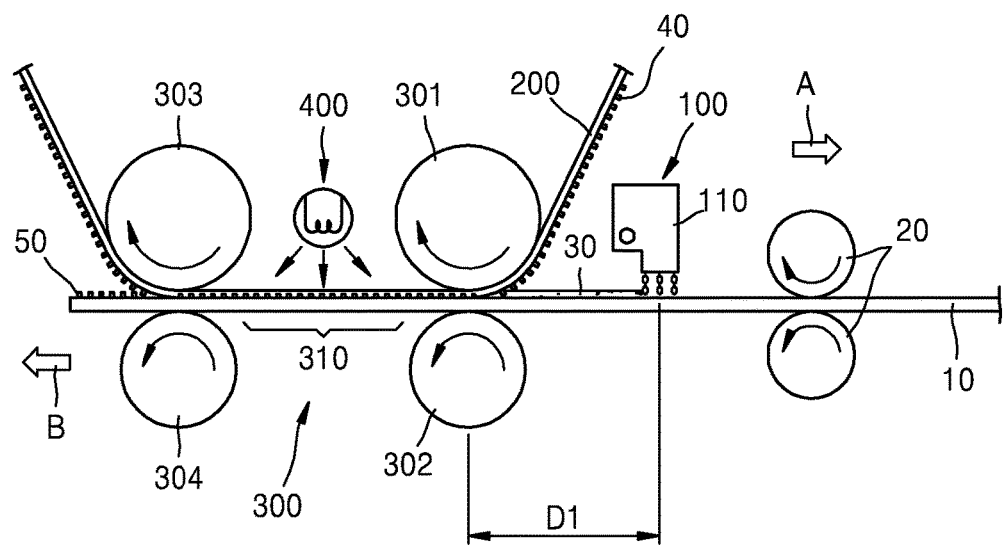
FIG. 1 is a structural diagram of an imprinting apparatus in which a substrate is transported, according to an embodiment of the present invention.

Reference will now be made in detail to embodiments, examples of which are illustrated in the accompanying drawings, wherein like reference numerals refer to like elements throughout and sizes of elements may be exaggerated for clarity and convenience of description. In this regard, the embodiments may have different forms and should not be construed as being limited to the descriptions set forth herein. Accordingly, the embodiments are merely described below, by referring to the figures, to explain features of the present description.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically, electrically and/or fluidly connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "above" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
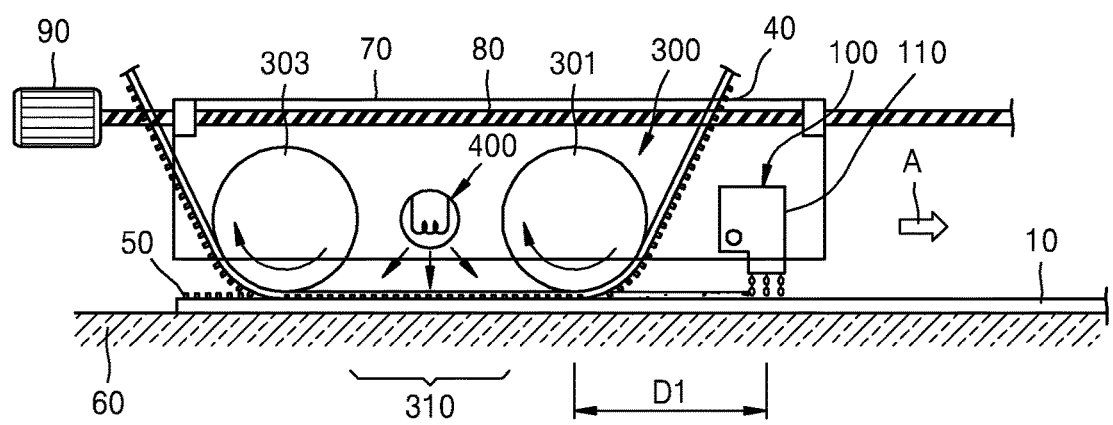
FIG. 2 is a structural diagram of an imprinting apparatus in which a coating unit, a pressing unit and a light source are transported, according to another embodiment of the present invention.
Figure 3:
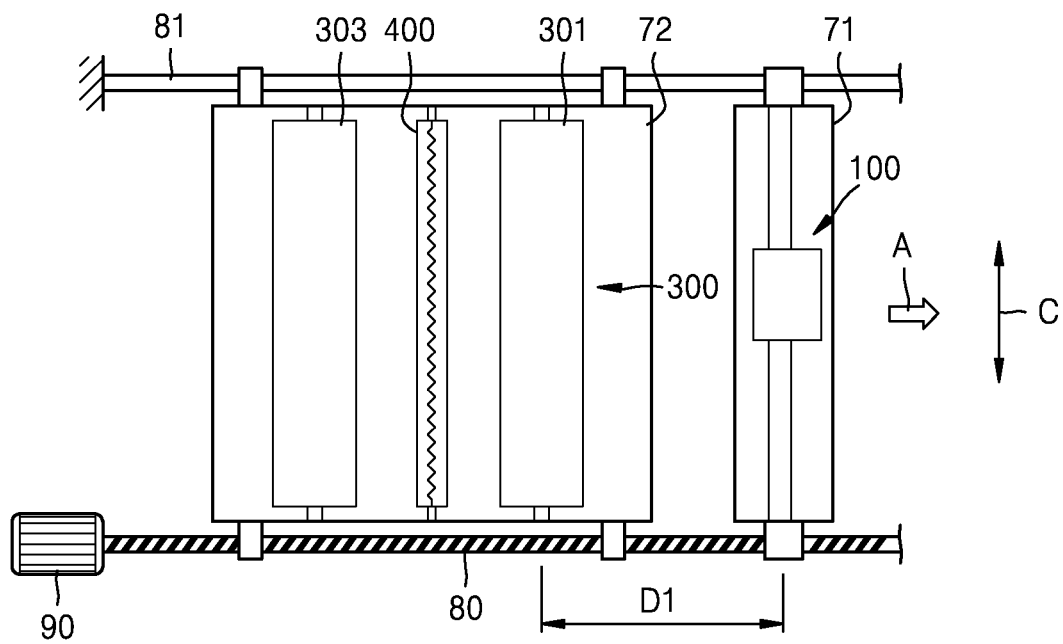
FIG. 3 is a structural top plan view diagram of an imprinting apparatus in which a coating unit, a pressing unit and a light source are transported, according to still another embodiment of the present invention.
Figure 4:
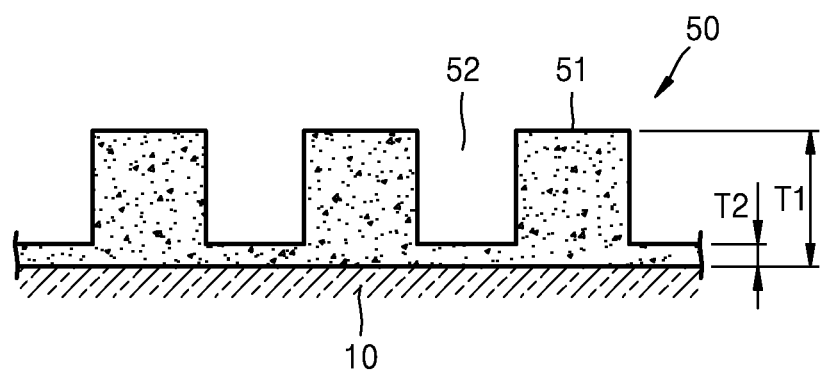
FIG. 4 is a cross-sectional view illustrating a minute pattern formed on a substrate by using a nanoimprint lithography method, according to an embodiment of the present invention.
Figure 5:
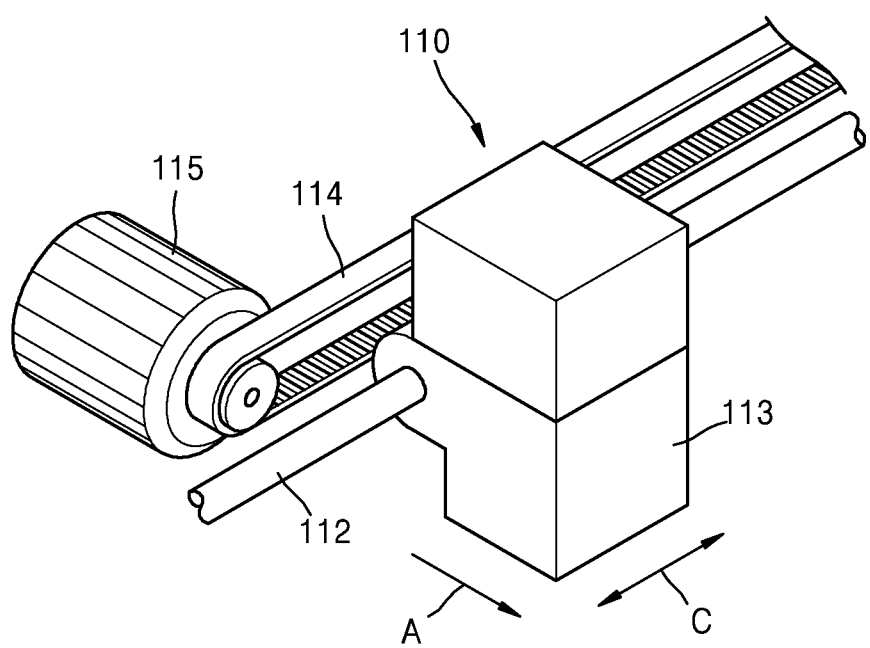
FIG. 5 is a structural diagram of an inkjet printing unit according to an embodiment of the present invention.

FIG. 1 is a structural diagram of an imprinting apparatus in which a substrate 10 is transported, according to an embodiment of the present invention. FIG. 2 is a structural diagram of an imprinting apparatus in which a coating unit 100, a pressing unit 300, and a light source 400 are transported, according to another embodiment of the present invention. FIG. 3 is a structural top plan view diagram of an imprinting apparatus in which the coating unit 100, the pressing unit 300, and the light source 400 are transported, according to still another embodiment of the present invention. FIG. 4 is a cross-sectional view illustrating a minute pattern 50 formed on the substrate 10 by using a nanoimprint lithography method, according to an embodiment of the present invention. FIG. 5 is a structural diagram of an inkjet printing unit 110 according to an embodiment of the present invention.

Referring to FIGS. 1, 2 and 3, the coating unit 100 configured to coat the substrate 10 with photocurable resin, the pressing unit 300 configured to press the substrate 100 with an imprint stamp 200, and the light source 400 configured to generate and emit light are illustrated.

The coating unit 100 coats the substrate 10 with, for example, solution including photocurable resin. The solution may be, for example, ink 30 including photocurable resin that is diluted in a diluent. The coating unit 100 may include an inkjet printing unit 110 configured to eject the ink 30 onto the substrate 10.

As illustrated in FIG. 5, for example, the inkjet printing unit 110 may include an inkjet head 113, a guide shaft 112 and a timing belt 114. The guide shaft 112 may extend in a width direction C of the substrate 10. The width direction C of the substrate 10 is perpendicular to a processing direction A. The inkjet head 113 is slidably mounted on the guide shaft 112. The timing belt 114 reciprocally travels in the width direction C of the substrate 10 via a driving motor 115. The timing belt 114 is connected to the inkjet head 113. According to this structure, the inkjet head 113 reciprocally travels in the width direction C of the substrate 10 along the guide shaft 112 and ejects ink such as including photocurable resin onto the substrate 10.

A structure of the inkjet printing unit 110 is not limited to the one illustrated in FIG. 5. Although not illustrated, for example, the inkjet head 113 may reciprocally travel in the width direction C of the substrate 10 along a lead screw that extends in the width direction C of the substrate 10 and is rotated via a motor (not shown). The inkjet head 113 may be a piezoelectric inkjet head that uses a piezoelectric element, but the invention is not limited thereto.

Referring again to FIGS. 1 and 2, an uneven pattern 40 corresponding to the minute pattern 50 may be defined or formed on the imprint stamp 200. The imprint stamp 200 may be, for example, in the form of a flexible sheet, on a surface of which the uneven pattern 40 is defined or formed.

The pressing unit 300 presses the substrate 10 and the imprint stamp 200 together to transfer a shape of the uneven pattern 40 into and/or onto the photocurable resin. The pressing unit 300 includes, for example, a first pressing roller 301 that presses the substrate 10 and the imprint stamp 200 to each other. According to the embodiment illustrated in FIG. 1, the first pressing roller 301 faces a first backup roller 302, with the substrate 10 therebetween. The shape of the uneven pattern 40 is transferred to the photocurable resin on the substrate 10 at a location between the first pressing roller 301 and the first backup roller 302.

According to the embodiment in FIG. 1, in order to form a pressing area 310 in which the substrate 10 and the imprint stamp 200 are pressed together, a second pressing roller 303 and a second backup roller 304 facing the second pressing roller 303 with the substrate 10 therebetween are disposed downstream in a moving direction of the substrate 10. The first and second pressing rollers 301 and 303 move the imprint stamp 200, which is in the form of a flexible sheet.

According to the embodiments of FIGS. 2 and 3, in order to form a pressing area 310 in which the substrate 10 and the imprint stamp 200 are pressed together, a table 60 supports the substrate 10 instead of the first and second backup rollers 302 and 304.

While the imprint stamp 200 is maintained pressed against the substrate 10, for example, light such as ultraviolet light from the light source 400 is irradiated onto the photocurable resin on the substrate to perform a curing operation. Accordingly, the minute pattern 50, as illustrated in FIG. 4, is formed on the substrate 10.

Resin used in nanoimprint lithography includes photocurable resin which is cured within a relatively short time when light having relatively high energy of a predetermined wavelength range, such as an ultraviolet ray (e.g., energy of about several to several tens of milliwatts per square centimeter ($mW/cm^2$)), is irradiated. The photocurable resin may be, for example, photocurable acrylic resin or photocurable vinyl ether-based resin.

In a pressing operation, the shape of the uneven pattern 40 is transferred to the photocurable resin on the base substrate 10 to thereby form the minute pattern 50 having a convex portion 51 and a concave portion 52, as illustrated in FIG. 4. Ideally, no resin remains in the concave portion 52, however, a predetermined amount of resin may remain in the concave portion 52. To minimize an influence of the remaining resin on a subsequent operation such as an etching operation, a thickness T2 of the resin at the concave portion 52 is minimized. In an embodiment, for example, when a thickness T1 of the resin at the convex portion 51 is about several hundreds of nanometers, the thickness T2 of the resin at the concave portion 52 may be about several to about several tens of nanometers. In an embodiment, for example, when the thickness T1 of the resin at the convex portion 51 is from about 100 nanometers (nm) to about 150 nm, the thickness T2 of the resin at the concave portion 52 may be about 30 nm.

In order to minimize the thickness T2 of the resin at the concave portion 52 and to form the minute pattern 50 that is uniform, the photocurable resin has excellent flowing characteristics such that the photocurable resin is uniformly spread, with a relatively small thickness, over the substrate 10, which is relatively large in a planar area dimension.

In order to obtain the above-described excellent flowing characteristics of the photo curable resin and allow ejection thereof by using an inkjet printing method, the photocurable resin may be diluted in a diluent and coated on the substrate 10 in a relatively low-viscosity state. A viscosity of the diluted photocurable resin may be about 30 centipoise (cP) or less, for example, about 10 cP. Also, a surface tension of the diluted photocurable resin may be about 30±20 millinewtons per meter (mN/m).

As the diluent, a solution including a reaction group in the same chemical group as the photocurable resin may be used so that the diluent may participate in a photocuring operation. In an embodiment, for example, acrylic photocurable resin may be diluted in a diluent having an acrylic reaction group, and a vinyl ether-based photocurable resin may be diluted in a diluent having a vinyl ether-based reaction group.

When a typical solvent (e.g., a solution not having a reaction group in the same chemical group as the photocurable resin) is used as a diluent, the typical solvent does not participate in a photocuring operation, and thus, after the photocuring operation, a minute pattern 50 having a volume from which the solvent is excluded is formed. Thus, when the typical solvent is used, a minute pattern 50 that is uniform and has a desired form and a desired thickness may not be obtained. However, according to one or more embodiment of the present invention, since the diluent includes a solution having a reaction group in the same chemical group as the photocurable resin, the diluent participates in the photocuring operation and a minute pattern 50 that is uniform may be formed.

In a comparable method of manufacturing a minute pattern, after completely coating the substrate 10 with the diluted photocurable resin, in a subsequent operation, the substrate 10 may be pressed together with the imprint stamp 200 and light may be irradiated to the substrate 10 to cure the photocurable resin on the substrate 10. As the diluent is volatile, while the diluted photocurable resin is being coated on the substrate 10, the diluent may volatilize. Thus, the amount of the diluted photocurable resin may not be uniform according to a position thereof on the substrate 10. That is, a volume of the diluted photocurable resin that is coated and diluted at a first time may be less than a volume of the diluted photocurable resin that is coated and diluted at a later second time after the first time. Thus, a thickness of the minute pattern 50 that is formed after a pressing operation and a photocuring operation are performed may not be uniform. Also, while the comparable method proceeds from the coating operation to the pressing operation, the diluent may volatilize, and thus, the amount of the diluted photocurable resin on the substrate 10 may be reduced. As a result, a thickness of the minute pattern 50 that is formed after the pressing and photocuring operations are performed may be less than a desired thickness.

To solve this problem, according to one or more embodiment of the nanoimprinting apparatus of the present invention, the coating unit 100 is located ahead of the pressing unit 300 by a distance D1 in the processing direction A, and the coating unit 100, the pressing unit 300 and the light source 400 move relative to the substrate 10 in the processing direction A. The coating unit 100, the pressing unit 300 and the light source 400 move at the same speed. Thus, during one or more embodiment of a method of manufacturing a minute pattern, a distance between the coating unit 100 and the pressing unit 300 is maintained as the distance D1 during a movement process.

As illustrated in FIG. 1, for example, the coating unit 100, the pressing unit 300 and the light source 400 may be located at fixed positions, and the substrate 10 may be moved via a transporting unit 20 in an arrow direction B, which is opposite to the processing direction A. According to this structure, as the substrate 10, which is relatively easy to move, is moved, the structure of the imprinting apparatus may be simplified. Also, the first and second pressing rollers 301 and 303 and the first and second backup rollers 302 and 304 also perform the function of moving the substrate 10, and thus, a structure for moving the substrate 10 may be simplified.

Alternatively, as illustrated in FIG. 2, the substrate 10 is fixedly supported by the table 60, and a single moving block 70 in which the coating unit 100, the pressing unit 300 and the light source 400 are mounted, is moved in the processing direction A. The moving block 70 may be mounted, for example, to a lead screw 80 that is disposed in the processing direction A. When the lead screw 80 is rotated via a driving motor 90, the moving block 70 may be moved in the processing direction A with the lead screw 80. According to this structure, even when the substrate 10 having a relatively small thickness is used, the substrate 10 may be flatly and stably supported.

Also, as illustrated in FIG. 3, the coating unit 100 may be mounted in a first moving block 71, and the pressing unit 300 and the light source 400 may be mounted in a second moving block 72. The first and second moving blocks 71 and 72 are supported by a guide shaft 81 and the lead screw 80 that are spaced apart in the width direction C of the substrate 10 and extend in the processing direction A. When the lead screw 80 is rotated via the driving motor 90, the first and second moving blocks 71 and 72 may be moved in the processing direction A. As the first and second moving blocks 71 and 72 are supported by the lead screw 80, moving speeds of the first and second moving blocks 71 and 72 are the same and a uniform distance between the pressing unit 300 and the coating unit 100 may be maintained.

Accordingly, in one or more embodiment of a method of manufacturing a minute pattern of the present invention, the coating operation of the diluted photocurable resin, the pressing operation and the photocuring operation are sequentially performed in a series. That is, after the substrate 10 is coated with the diluted photocurable resin by using the coating unit 100, the substrate 10 is immediately pressed by the imprint stamp 200 by using the pressing unit 300 that follows the coating unit 100. As described above, as the distance D1 between the coating unit 100 and the pressing unit 300 is maintained to be uniform, a volatilization period of the diluent between the coating operation and the pressing operation is uniform. Accordingly, the amount of volatilization of the diluent between the coating operation and the pressing operation is uniform, and thus, a non-uniform thickness of the minute pattern 50 according to positions thereof on the substrate 10 may be reduced or effectively prevented.

Also, in one or more embodiment of a method of manufacturing a minute pattern of the present invention, as the coating operation, the pressing operation and photocuring operations are continuously performed, a time interval between the coating operation, the pressing operation and photocuring operations may be reduced to thereby form the minute pattern 50 having a desired thickness. Also, as the amount of volatilization of the diluent may be reduced, the amount of the photocurable resin being used may also be used, thereby reducing manufacturing costs.

A nanoimprinting method according to the above-described configuration will be described.

Coating Operation

While moving the coating unit 100 relative to the substrate 10 in the processing direction A, the ink 30 including the photocurable resin is ejected onto an upper surface of the substrate 10. An ejection amount, an ejection interval, etc. of the ink 30 may be determined according to the shape of the minute pattern 50 to be finally formed. Also, the ejection amount of the ink 30 may be determined in consideration of the volatilization amount of the diluent that is determined based on the distance D1 between the coating unit 100 and the pressing unit 300 and a processing speed.

According to the one or more embodiment of the present invention, the inkjet printing unit 110 that reciprocally moves in the width direction C of the substrate 10 is used as the coating unit 100. As the inkjet printing unit 110 may eject a minute amount of the ink 30, a minute linear pattern having a small line width may be formed. Also, various patterns may be formed by using the inkjet printing unit 110 since a size and an ejection amount of ink droplets are easily controlled. Also, the inkjet printing unit 110 may eject the ink 30 onto the relatively large planar size substrate 10 quickly and uniformly. Thus, by using the inkjet printing unit 110 as the coating unit 100, the minute pattern 50 of a large size may be easily formed.

Pressing Operation

The imprint stamp 200 is supplied to the pressing unit 300 that is spaced apart from the coating unit 100 by the distance D1, in the opposite direction to the processing direction A. As the pressing unit 300 moves relative to the substrate 10 at the same speed as the coating unit 100, the uneven pattern 40 of the imprint stamp 200 contacts or is pressed with respect to the ink formed on the upper surface of the substrate 10. Then, the ink on the substrate 10 is filled in a concave portion of the uneven pattern 40 via a capillary phenomenon, and the uneven pattern 40 is transferred to the ink on the substrate 10. The imprint stamp 200 is maintained contacting or pressed against the ink on the upper surface of the substrate 10 within the pressing area 310.

As described above, as the pressing operation is performed immediately after the coating operation, the amount of volatilization of the diluent may be minimized. Accordingly, the amount of the ink that is used may be reduced. In addition, as a time interval between the coating operation and the pressing operation is uniform, the amount of volatilization of the diluent may be easily predicted. Thus, by controlling an ejection amount of the ink during the coating operation in consideration of the predicted volatilization amount of the diluent, the minute pattern 50 having an overall uniform thickness may be formed and a desired thickness of the finally formed minute pattern 50 may be precisely formed.

Photocuring Operation

The light source 400 in the pressing area 310 irradiates, for example, an ultraviolet ray to the ink 30. With the irradiated light, the photocurable resin included in the ink 30 is rapidly cured, and a photocurable reaction group of the diluent also participates in the curing process. Accordingly, the minute pattern 50, to which the uneven pattern 40 is previously transferred, is formed on the upper surface of the substrate 10. As described above, as the diluent is involved in the photocuring reaction, the thickness of the minute pattern 50 formed on the substrate 10 after the photocuring operation may be easily predicted so as to form a final minute pattern having a precise thickness.

It should be understood that the embodiments described herein should be considered in a descriptive sense only and not for purposes of limitation. Descriptions of features within each embodiment should typically be considered as available for other similar features in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An imprinting apparatus comprising:
    a coating unit which coats a substrate with ink comprising a photocurable resin in a diluent;
    a pressing unit which presses the ink with an imprint stamp comprising an uneven pattern;
    a light source which irradiates light to the ink, which is in a pressed state, and cures the photocurable resin;
    a table which supports the substrate at a fixed location, and
    a moving block in which the coating unit, the pressing unit and the light source are mounted,
    wherein
    the coating unit, the pressing unit and the light source are configured to move relative to the substrate in a processing direction while coating the substrate with the ink, pressing the ink with the imprint stamp and curing the photocurable resin are performed,
    the moving block moves in the processing direction, and
    the coating unit is located ahead of the pressing unit in the processing direction.

2. The imprinting apparatus of claim 1, wherein the coating unit comprises an inkjet printing unit which ejects the ink onto the substrate.

3. The imprinting apparatus of claim 2, wherein the diluent comprises a reaction group in a same chemical group as the photocurable resin.

4. The imprinting apparatus of claim 3, wherein a viscosity of the ink is about 30 centipoise or less.

5. The imprinting apparatus of claim 4, wherein a surface tension of the ink is about 30±20 millinewtons per meter.

6. The imprinting apparatus of claim 1, wherein the moving block is provided in plural, comprising:
    a first moving block in which the coating unit is mounted, and
    a second moving block separate from the first moving block and in which the pressing unit and the light source are mounted.

7. An imprinting method comprising:
    preparing the imprinting apparatus of claim 1;
    the coating unit coating an upper surface of the substrate with the ink, while moving the coating unit relative to the substrate in the processing direction;
    the pressing unit pressing the ink with the imprint stamp, while moving the pressing unit in the processing direction at the same speed as the coating unit; and
    the light source curing the photocurable resin by irradiating the light to the ink in the pressed state.

8. The imprinting method of claim 7, wherein in the coating, the upper surface of the substrate is coated with the ink by using an inkjet printing unit.

9. The imprinting method of claim 8, wherein the diluent comprises a reaction group in a same chemical group as the photocurable resin.

10. The imprinting method of claim 9, wherein a viscosity of the ink is about 30 centipoise or less.

11. The imprinting method of claim 10, wherein a surface tension of the ink is about 30±20 millinewtons per meter.

12. The imprinting method of claim 7, further comprising fixing a distance between the coating unit and the pressing unit.

13. The imprinting method of claim 7, further comprising:
    fixing the substrate in a location, and
    moving the coating unit and the pressing unit the processing direction.

* * * * *